(12) United States Patent
Pham et al.

(10) Patent No.: US 6,405,143 B1
(45) Date of Patent: Jun. 11, 2002

(54) METHOD AND SYSTEM FOR DETERMINING POTENTIAL FIELDS

(75) Inventors: Hoan Huu Pham, Mississauga; Arokia Nathan, Waterloo, both of (CA)

(73) Assignee: The University of Waterloo, Waterloo (CA)

( * ) Notice: Subject to any disclaimer, the term of this patent is extended or adjusted under 35 U.S.C. 154(b) by 0 days.

(21) Appl. No.: 09/373,574

(22) Filed: Aug. 13, 1999

Related U.S. Application Data

(60) Provisional application No. 60/096,696, filed on Aug. 14, 1998.

(51) Int. Cl.[7] .............................................. G01R 15/00
(52) U.S. Cl. ............................ 702/57; 702/8; 702/26; 702/40; 702/94; 324/72; 324/300; 324/348; 324/357
(58) Field of Search .............................. 702/57, 81, 94, 702/109, 120, 40, 8, 26; 324/300, 348, 357, 72

(56) References Cited

PUBLICATIONS

Pham et al., "Computation of the potential field and its gradient using exponential expansion," Electrical and Computer Engineering, vol. 2, pp. 750–753, May 1998.*

Pham et al., "A new numerical method for extraction of overlap capacitance in a–Si TFT's," IEEE Electron Device Letters, vol. 20, No. 1, pp. 30–32, Jan. 1999.*

Pham et al., "An integral equation of the second kind for computation of capacitance", IEEE transaction on computer–aided design of integrated circuits and system, vol. 18, No. 10, pp. 1435–1441, Oct. 1999.*

\* cited by examiner

*Primary Examiner*—John S. Hilten
*Assistant Examiner*—Hien Vo
(74) *Attorney, Agent, or Firm*—Gowling Lafleur Henderson LLP

(57) ABSTRACT

A method for determing the potential in a three-dimensional domain containing a source domain of source particles and a target domain of target particles involves assigning the source particles into source particle clusters and the target particles into target particle clusters, assigning a collection point to each of the clusters, and determing the inverse distance from each particle to the collection point of its respective cluster. A pseudo-particle representative of each particle within the cluster is defined at the collection point of each cluster in accordance with the determined inverse distances and the charge-like measure of each of the particles. The potential, and/or its gradient, at any of the target particles is then determined from the position and the charge-like measure of the associated pseudo-particle.

13 Claims, 13 Drawing Sheets ical fields.

METHOD AND SYSTEM FOR DETERMINING POTENTIAL FIELDS

PRIORITY

The present application claims priority from U.S. Provisional Application No. 60/096,696 filed Aug. 14, 1998, the contents of which are incorporated herein by reference.

FIELD OF THE INVENTION

The present invention relates generally to methods and systems for determining potential fields, and more specifically relates to computer implemented method and system for determining potential fields.

BACKGROUND OF THE INVENTION

With the rapid increase in both component density and operating frequency of integrated circuits, the parasitic coupling capacitance associated with interconnects can pose serious design issues. For example, these issues are prevalent in the design of large-area high-resolution amorphous silicon ("a-Si") arrays for applications in X-ray imaging or active-matrix liquid-crystal displays. In these two specific areas, the number of parasitic capacitances increase with increasing component density, while the interconnect capacitance due to the crossover of the gate and data lines introduces electronic noise, thus undermining the quality of the image. Further, the capacitive coupling due to geometric overlapping between the gate and source/drain electrodes in the TFT can give rise to charge feed through thus lowering the pixel voltage. To gain insight into the effect of parasitic coupling capacitance on the overall array performance, it is desirable to accurately and efficiently extract the capacitance during the design process. In addition, this can aid in further development of equivalent circuit models for effective SPICE-like simulations for sensitivity analysis and design optimization.

However, there are several computational difficulties in the numerical extraction of capacitance in certain electronic circuits. For example, in a-Si TFTs and imaging arrays at least three computational difficulties arise. One computational difficulty arises from the extreme device geometries, in which the ratio of thin film thickness to other physical dimensions (such as the width and length) can well be of the order of $10^{-3}$. Another difficulty arises from the floating potential of the glass substrate, because the substrate needs to be included as part of the computational domain. A third problem arises in the treatment of multi-dielectric media, where the electric field is discontinuous across dielectric interfaces, thus requiring the computation of the electric field and therefore necessitating precise computation of the potential field. Overall, the extreme geometry of metal lines and active devices, and the presence of the glass substrate, require a large number N of panels (or mesh elements) to barely resolve the surfaces of interconnects and the interfaces between two dielectric media. This can lead to a very large system of equations.

Other computational difficulties can arise in electrical systems where the determination of capacitance is calculated based on the distribution of charge density on the surface of conductors within the system. Hence, the efficient extraction of capacitance can require the efficient evaluation of the charge density within the system. The charge density problem can be formulated in terms of a system of integral equations involving the electric potential $\Phi$ and associated its gradient $\nabla \Phi$. However, the overall computational accuracy and performance in solving the system of integral equations lies in the evaluation of the potential $\Phi$ and its gradient $\nabla \Phi$ at all points of interest. Therefore, the efficient evaluation of the capacitance reduces to the efficient evaluation of the potential and the electric field itself, i.e. the gradient of the potential, within the system.

In a more general context, the computation of the potential field is of interest in many research areas ranging from astrophysics, plasma, physics, molecular dynamics, to VLSI and electro-mechanical systems ("MEMS"). In these systems, the potential of a number of particles located throughout a three-dimensional domain and, where each particle has an associated real value ($q_i$, i=1 ... N) is given by the well-known 1/r dependence formula:

$$\Phi(X_i) = \sum_{j=1, j \neq i}^{N} \frac{q_j}{\|X_i - X_j\|} \qquad \text{Equation 1}$$

where:
$\Phi$ is the potential
N is the number of particles
$X_i$, i=1 ... N is the location of each particle
$q_i$, i=1 ... N is the charge of each particle
$\|X_i - X_j\|$ is the distance r between each particle.

If the evaluation of Equation 1 is performed through direct pairwise particle-to-particle interactions, the computational time is of the order $O(N^2)$, which in most computers is prohibitively expensive for a large number N of particles. Prior art methods have somewhat reduced this computational time through the use of innovative operations. For example, see J. Barnes and P. Hut, "A hierarchical O(N log N) force-calculation algorithm", *Nature*, vol 324, pp. 446–449 ("Barnes & Hut"). See also, L. Greengard, *The Rapid Evaluation of Potential Fields in Particle Systems*, MIT Press, 1988 ("Greengard"). See also L. Greengard and V. Rhokhlin, "A new version of the fast multipole method for the Laplace equation in three dimensions", Tech. Rep. YALEU/DCS/RR-1115, Yale University, September 1996 ("Greengard/Rhokhlin").

Such prior art methods can evaluate the potential in a reduced computational time of only O(N log N) or even O(N). Computational time is reduced by the replacement of a cluster of particles with a single pseudo-particle which is representative of all particles within the cluster. Thus, subsequent steps in the operation need only determine the potential associated with the pseudo-particle. The step involved of creating of the pseudo-particle is usually referred to as a "translation".

Underlying prior art translations is a multipole expansion ("MP") operation. In multipole expansions, a tree-like hierarchy of cubes is used in the clustering of the particles and the addition theorem in spherical harmonics is the mathematical background for the translations. The order of the expansion p of the potential in terms of spherical harmonics characterizes the overall performance of the multipole-expansions. The numerical effort in the multipole-expansion method lies in obtaining the expansion coefficients efficiently through a sequence of translations, namely:

1. from source points to multipole centres, defined in the prior art as "Q2M" translations;
2. from multipole centres to multipole centres, defined in the prior art as "M2M" translations;
3. from multipole centres to local centres, defined in the prior art as "M2L" translations;
4. from local centres to local centres, defined in the prior art as "L2L" translations; and,
5. from local centres to the target point for evaluation of the potential at the target, defined in the art as "L2P" translations.

Despite presenting improvements over calculations using Equation 1, certain disadvantages remain with the prior art. For example, the prior art utilizes translations with different structures: one for M2M, another for M2L, and yet another for L2L. Furthermore, Greengard involves a double sum, while Greengard/Rhokhlin involves a single sum with tight coupling between the multipole and local expansion coefficients in the spherical harmonics expansion. Another problem with the prior art is that the accuracy inherently depends on the order of the expansion p in terms of spherical harmonics and on how the M2L translations are performed. See, for example, H. Petersen, E. Smith and D. Soelvason, "Error estimates for the fast multi-pole method. II. The three-dimensional case," *Proc. R. Soc. Lond. A*, vol. 448, pp. 401–418, 1995. A third problem is that the computation time inherently depends on the order of the expansion and on the trade-off between computational time and memory in choosing the interaction list for M2L translations. The computation time is O(N log N) in Barnes & Hut, $O(p^4)$ in Greengard and $O(p^3)$ in Greengard/Rhokhlin. These speeds can be prohibitively high for certain computers and for certain large numbers of particles. A fourth problem is that the prior art can require a large amount of computer memory. The multipole and local expansion coefficients have to be stored explicitly. In Greengard, the memory requirement is $O(p^2)$, while Greengard/Rhokhlin can require $O(6p^2)$ extra memory units for storing the exponential expansion coefficients at cubes which are being affected by M2L translations. Yet another problem with the prior art is that the formulation and the evaluation of the gradient of the potential in MP methods is quite complex, as discussed in Nabors K. & White J. 1992 "Multipole-accelerated capacitance extraction algorithms for 3-d structures with multipole dielectrics" *IEEE Trans. On Circuits and Systems*, 39, 946–954.

In summary, despite prior art improvements over methods and systems utilizing direct pair-wise calculations of potentials using Equation 1, it can be seen that there is a need for another method and system for the evaluation of a field potential in three dimensions.

SUMMARY OF THE INVENTION

It is therefore an object of the present invention to provide a novel method and system for determining potential fields which obviates or mitigates at least one of the disadvantages of the prior art.

In an embodiment of the invention, there is provided a method for determining a potential using a computer having a user-input device, a processing device, and a user-output device comprising the steps of:

receiving data representing positions and charge-like measures for each of a plurality of source particles and target particles;

assigning the source particles and the target particles into at least one cluster of source particles and at least one cluster of target particles;

selecting a collection point for each of the clusters;

performing an exponential expansion operation for each of the particles to determine an inverse distance between each of the collection points and the positions of particles within their respective cluster, the exponential expansion operation being performed over a range determined from a desired level of computational precision of the distance;

defining a pseudo-particle at each of the collection points based on the inverse distances and the charge-like measures, the pseudo-particle having a position at the collection point and a charge-like measure representing the collective charge-like measures of each particle associated with the collection point; and, determining a potential at one of the target particles based on an operation that considers at least in part the position and the charge-like measure of at least one of the pseudo-particles.

A method and system for the rapid determination of a potential in a three-dimensional domain containing a source domain of source particles and a target domain of target particles is provided. The method and system is suitable for determining a potential field, and/or its gradient, at a given target particle within the target domain, particularly in systems where there are a large number of particles. A presently preferred system includes a computer having a processing unit, monitor and keyboard and/or any other suitable user-output devices and/or user-input devices. The system is operable to execute a presently preferred method that is incorporated into the computer processing unit and receives data representative of positions and charge-like measures of each particle within the three-dimensional domain via a user-input device attached to the processing unit. The method then assigns the source particles into source particle clusters and the target particles into target particle clusters. The method then assigns a collection point to each of the clusters. Next, the method performs an exponential expansion operation on each of the particles to determine the inverse distance from the particle to the collection point of its respective cluster. The exponential expansion operation is based on an exponential integral representation of Green's function 1/r and an approximation to the integral using Gauss quadratures. Next, a pseudo-particle representative of each particle within the cluster is defined at the collection point of each cluster. The pseudo-particle is determined from an operation that considers the inverse distances determined using the exponential expansion and the charge-like measure of each of the particles. The steps in the method are repeated until a desired level of clustering is achieved, which is generally until there is a single source pseudo-particle representative of all source particles, and a single target pseudo-particle representative all target particles. Using the gathered information, known techniques can be used to determine a potential, and/or its gradient at any of the target particles, as desired. It is generally contemplated that the method and system can be used in a variety of applications including electronics, astro-physics, plasma-physics, molecular dynamics and the like.

BRIEF DESCRIPTION OF THE DRAWINGS

The present invention will now be explained, by way of example only, with reference to certain embodiments and the attached Figures in which.

DETAILED DESCRIPTION OF THE INVENTION

Figure 1:
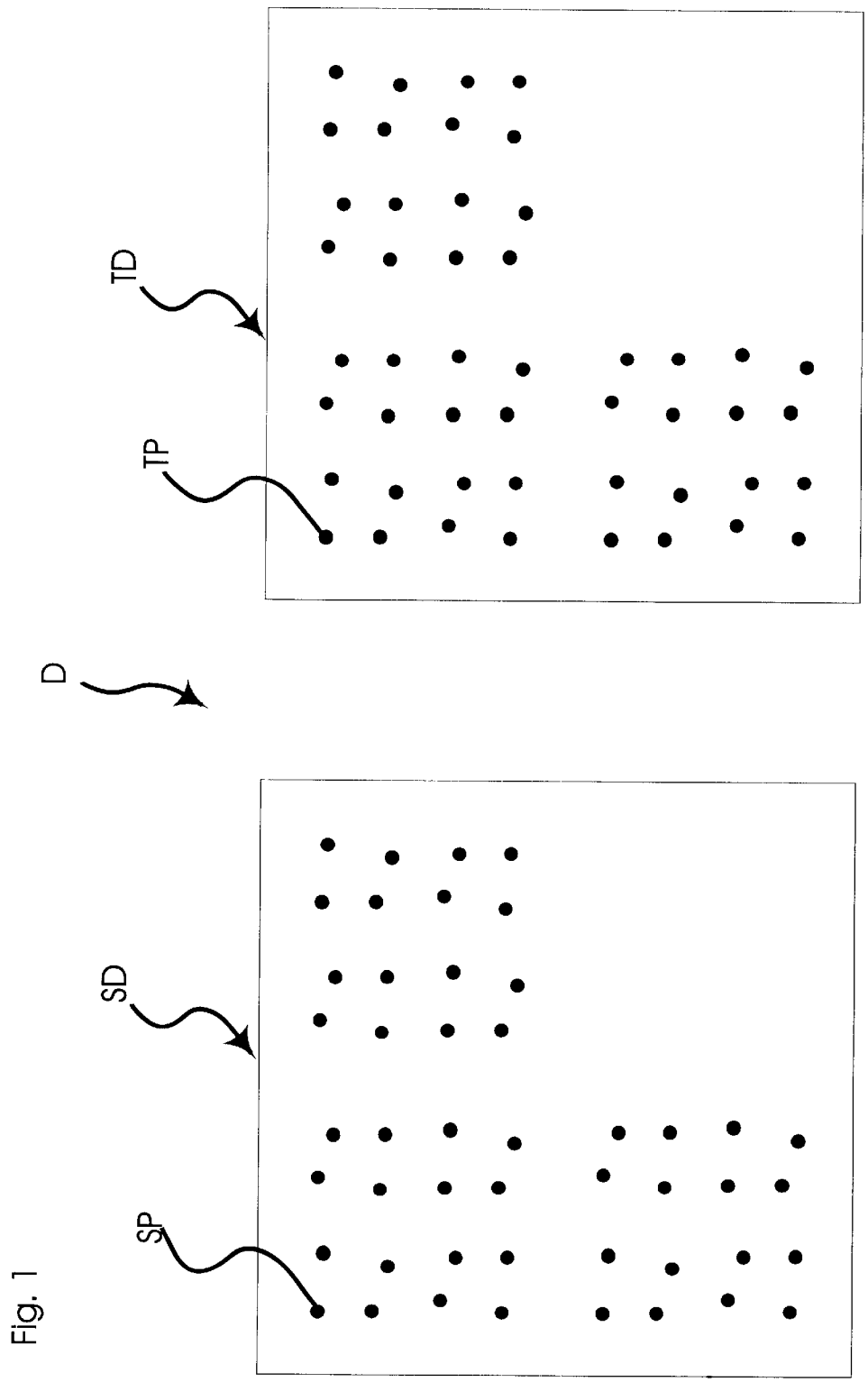
FIG. 1 is a schematic diagram of a domain of particles, including a source domain and a target domain.

FIG. 1 shows a schematic representation of a domain D including a source domain SD of containing a plurality of source particles SP and a target domain TD containing a plurality of target particles TP. Domain D can be any domain where a potential at a target particle TP is sought to be determined, such as, for example, an integrated circuit, where source particles SP are gate lines, or portions thereof, and target particles TP are data lines, or portions thereof. Another example of domain D is two solar systems where source particles SP compose one solar system of planets and/or other masses, and target particles TP compose a second solar system of planets and/or other masses. In general, domain D can any type of system, such as found in electronics, magnetics, astrophysics, plasma physics, molecular dynamics, fluids where a potential can be calculated at any target particle TP and such potential is determined, at least in part, by the relationship:

$$1/r \qquad \text{Equation 2}$$

where r is the distance between any two particles within domain D, and 1/r is the inverse distance thereof. As such, it will be understood that the term "particle" as used herein should not be construed in a limiting sense, but should be construed in the context of the particular domain D where it is desired to calculate a potential.

While FIG. 1 shows domain D in two-dimensional space, it is to be understood that domain D can be three-dimensional space and that each particle within domain D has a vector position defined within. three-dimensions. In addition, each particle within domain D has a charge-like measure. For example, where domain D is an integrated circuit and the desired potential is a voltage, then each particle would have a measure of charge "q" expressed in units of coulombs. Where domain D includes two solar systems and each particle within domain D is a planet, and the gravitational field at some target planet has an associated potential, then the charge-like measure of each particle or planet is mass "M", which can be expressed in units of, for example, kilograms. For purposes of the present invention, it is desirable that the position and charge-like measure of each particle are represented in the form of computer-readable data.

Figure 2:
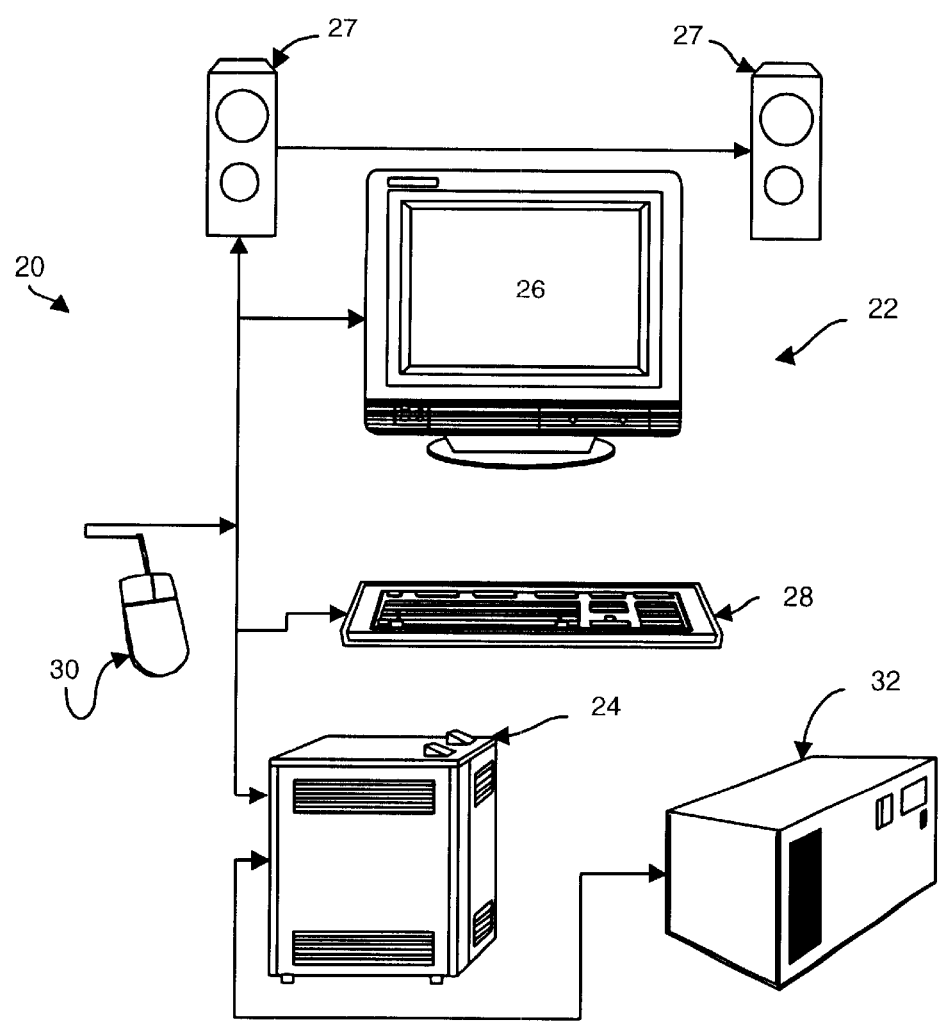
FIG. 2 is a computer suitable for implementing a system for determining a potential in accordance with an embodiment of the invention.

FIG. 2 shows a system 20 operable: to perform a method to determine a potential at any target particle TP in domain D in accordance with an embodiment of the present invention. System 20 comprises a computer 22 having a processing unit 24 including any operable configuration of central processing unit and random access memory such as a Pentium 166MMX with 32 MB. As will be explained in greater detail in the discussion below, the type and speed of the central processing unit, and the amount of memory, are scalable in accordance with the number of particles within domain D and the desired speed and accuracy of the determination of a potential at a given target particle TP.

Computer 22 also includes user-output devices in the form of a monitor 26 and speakers 27 which are operable connected to processing unit 24 to present visual and audio representations, respectively, of data, such as the potential at a target particle TP, generated by processing unit 24. Other user-output devices can be included as will occur to those of skill in the art.

Computer 22 further includes user-input devices in the form of a keyboard 28 and a mouse which are operably connected to provide user-input data to processing unit 24. and a hard disk-drive 32. Other user-input devices can be included as will occur to those of skill in the art.

Computer 22 further includes a persistent storage device in the form a hard-disc drive 32, which is operably connected to processing unit 24. It will be understood that other storage devices can be included as will occur to those of skill in the art.

Figure 3:
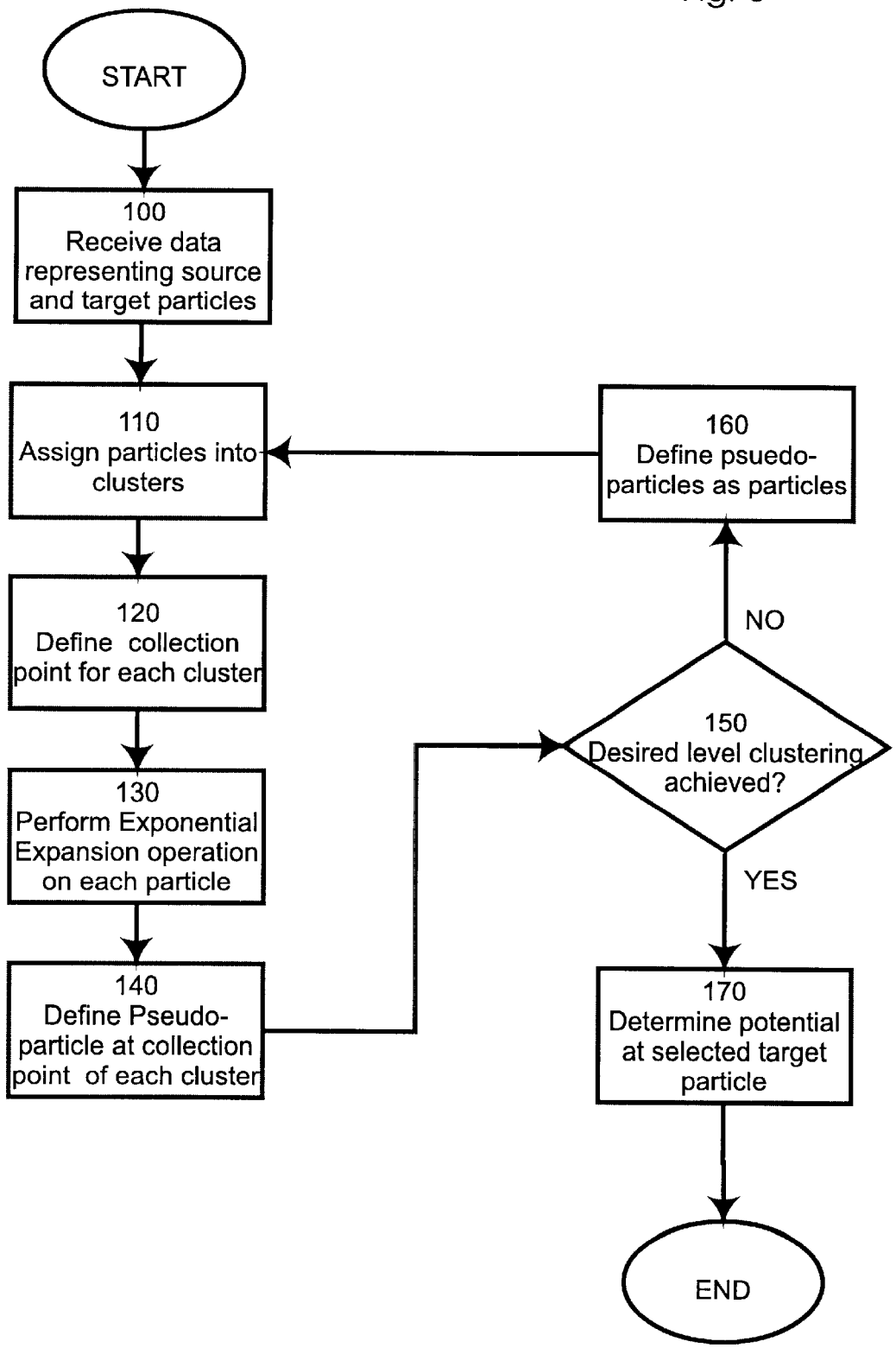
FIG. 3 is a flow-chart of a method for determining a potential in accordance with another embodiment of the invention.
Figure 4:
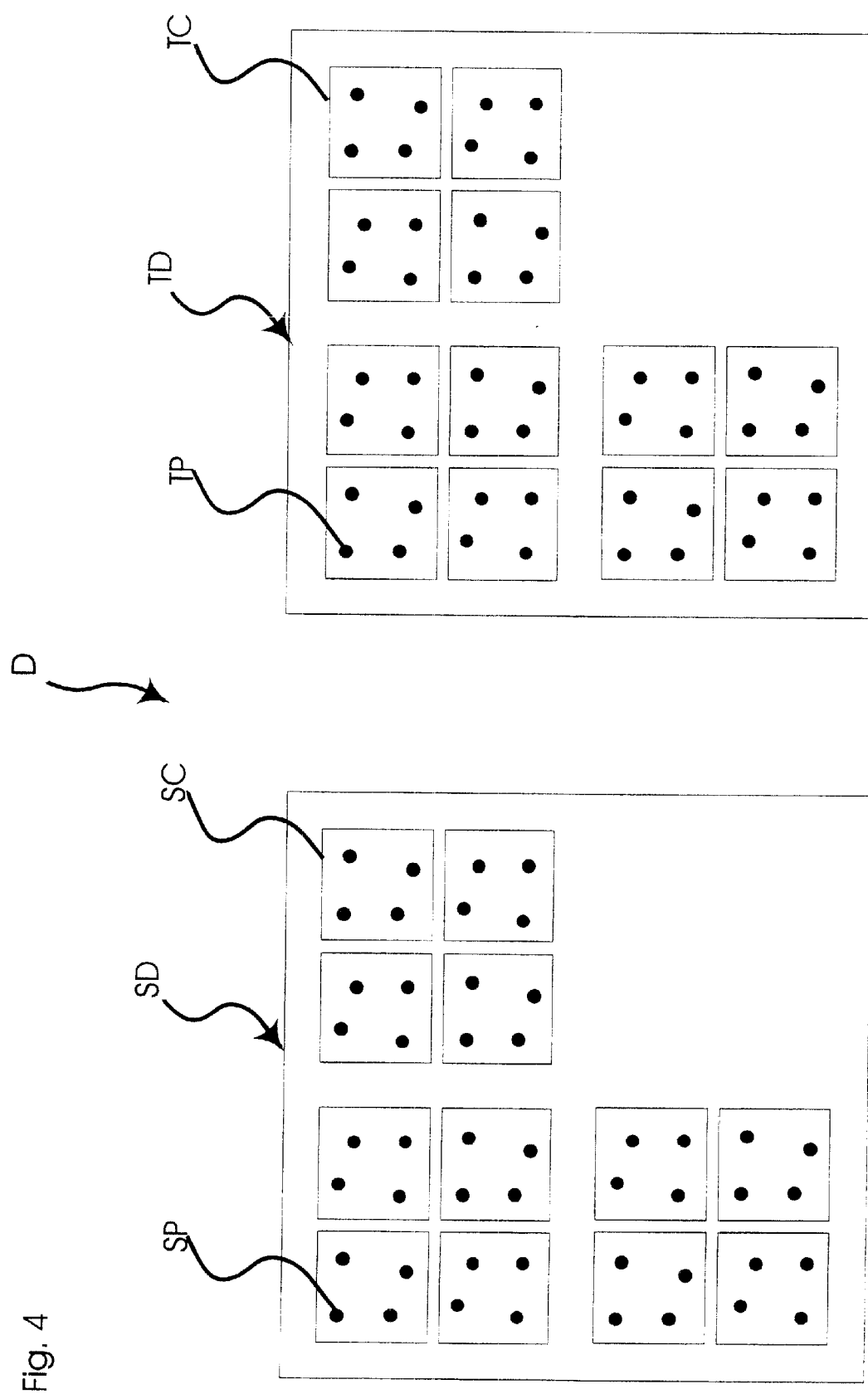
FIG. 4 is a schematic diagram of the domain of FIG. 1 showing a clustering of particles accordance with the method shown in FIG. 3.

FIG. 3 shows a method for determining a potential at any target particle TP within domain D which is suitable for execution on processing unit 24 and is in accordance with an embodiment of the invention. At step 100, data representing the vector positions and the charge-like measures of source particles SP and target particles TP is received by processing unit 24 via keyboard 28 or other suitable user-input device. At step 110, source particles SP are assigned into at least one cluster and target particles TP are assigned into at least one cluster. Referring now to FIG. 4, step 110 is shown in greater detail, where source particles SP are assigned into twelve source clusters SC and target particles TP are assigned into twelve target clusters TC. The number of desired source clusters SC and target clusters TC can be selected by any suitable means, such as by providing user-input via keyboard 28, or the number can be preset, or the number can be determined based on an operation that considers the number of source particles SP and target particles TP. As will be discussed in greater detail below, the number of source clusters SC and target clusters TC can be selected to achieve a desired level of computational efficiency. Other means of selecting the number of clusters will occur to those of skill in the art, and it is to be understood that there need not be an equal number of source clusters SC and target clusters TC.

Figure 5:
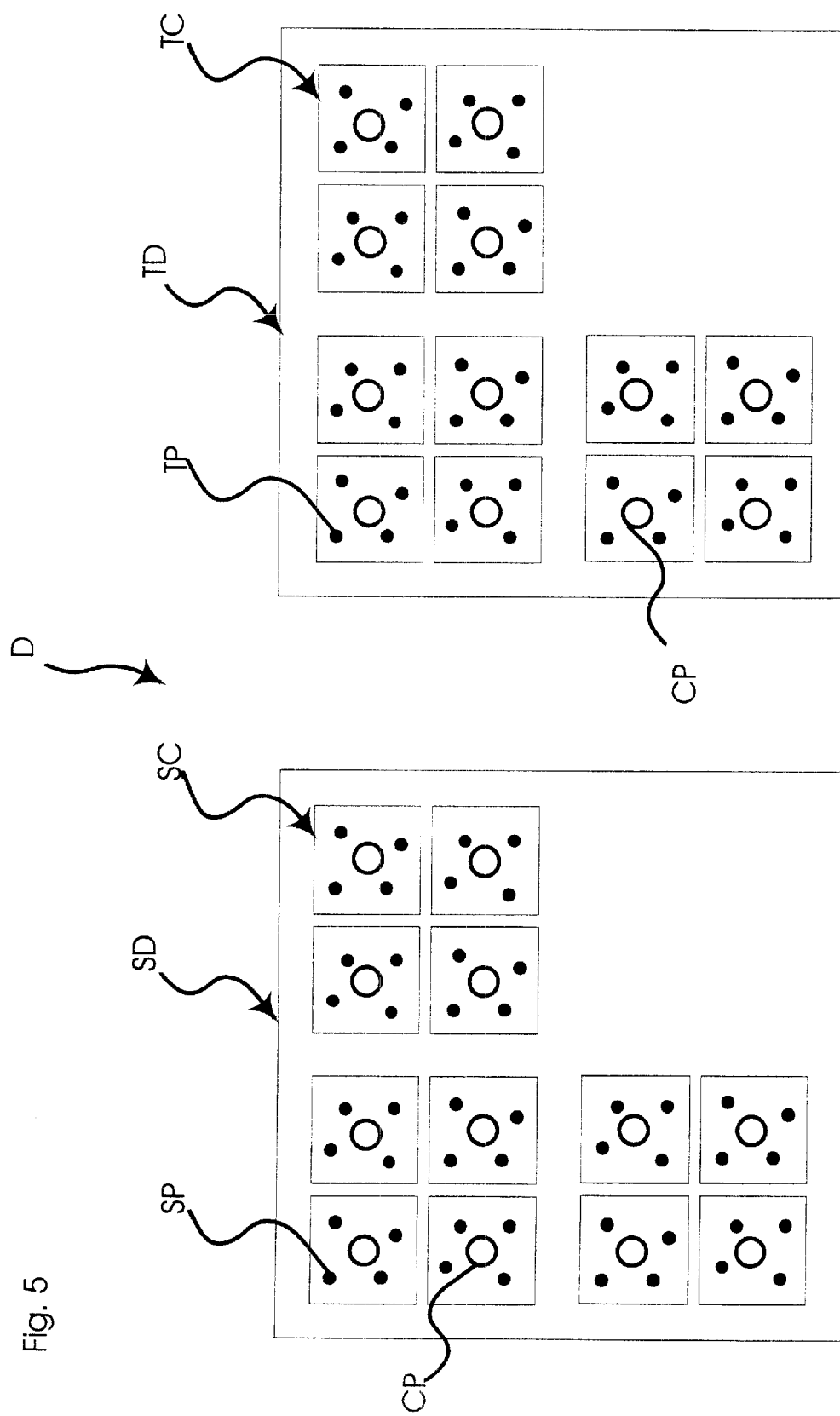
FIG. 5 is a schematic diagram of the domain of FIG. 1 showing an assignment of a collection point within each cluster of particles in accordance with the method shown in FIG. 3.

Referring again to FIG. 3, at step 120 a collection point for each source cluster SC and each target cluster TC is defined. Referring now to FIG. 5, step 120 is shown in greater detail, where a collection point CP is indicated at the centre of each source cluster SC and each target cluster TC. It is presently preferred that each collection point CP is assigned a position at the centre of each cluster. It will be understood that, in other embodiments, each collection point CP can be located virtually anywhere within domain D.

Referring again to FIG. 3, at step 130 an exponential expansion operation is performed on each source particle SP and each target particle TP. The exponential expansion operation of the present invention determines the inverse distance, stated herein as 1/r, between each particle and the collection point CP of the particle's respective cluster.

In the preferred embodiment, the exponential expansion operation is implemented in a computer language based on an exponential integral representation of Green's function for 1/r, expressed below:

$$\frac{1}{r} = \frac{1}{\sqrt{x^2 + y^2 + z^2}} = \int_0^\infty e^{-\lambda z} J_0(\rho\lambda) d\lambda \qquad \text{Equation 3}$$

where:

z>0, and $\rho = \sqrt{x^2+y^2}$ $J_0$ is the Bessel function of the first kind with order 0.

As will be understood by those of skill in the art, the validity of Equation 3 can be verified with the Laplace transform of the Bessel function $J_0$:

$$L\{J_0\} \equiv F(s) = \int_0^\infty e^{-st} J_0(ct) dt \qquad \text{Equation 4}$$

$$= \frac{1}{\sqrt{s^2 + c^2}}$$

thus, where s=z and c=ρ

$$\int_0^\infty e^{-st} J_0(ct) dt = \frac{1}{\sqrt{x^2 + y^2 + z^2}} \qquad \text{Equation 5}$$

As is known to those of skill in the art, the: Bessel function $J_0$ can be expressed in terms of an exponential integral, and by taking advantage of the periodicity of the integrand, it can be stated that:

$$J_0(\rho\lambda) = \frac{1}{2\pi} \int_0^{2\pi} e^{i\lambda(x\cos\alpha + y\sin\alpha)} d\alpha \qquad \text{Equation 6}$$

$$= \text{Re}\left(\frac{1}{\pi} \int_0^{\pi} e^{i\lambda(x\cos\alpha + y\sin\alpha)} d\alpha\right)$$

where $i=\sqrt{-1}$.

Thus, from Equations 3 and 6, we can obtain the following exponential integral representation of 1/r:

$$\frac{1}{r} = \frac{1}{\sqrt{x^2 + y^2 + z^2}} \qquad \text{Equation 7}$$

$$= \text{Re}\left(\frac{1}{\pi} \int_0^\infty e^{-\lambda z} \int_0^\pi e^{i\lambda(x\cos\alpha + y\sin\alpha)} d\alpha d\lambda\right)$$

In a present embodiment of the invention, Equation 7 is implemented on system 20, using Gauss quadratures, where:

$$1/r \approx \text{Re}[S^{Up}(x,y,z)] \qquad \text{Equation 8}$$

for all point (x,y,z) in the set $D_b^{Up}$ defined as:

$$D_b^{Up} \triangleq \{(x,y,z)|a=1 \leq z \leq b, \max(-b,-z-2) \leq x,y \leq \min(b,z+2)\} \qquad \text{Equation 9}$$

where b is an integer in the form $2^m$, (m≥2), that indicates how far in the "Up" or +z direction a point (x,y,z) can be in the set $D_b^{Up}$.

Also, the symbol $S^{Up}$ is defined as:

$$S^{up}(x, y, z) \triangleq \sum_{k=1}^{S_{outer}} \varpi_k \sum_{j=1}^{S_{inner}(k)} E^{Up}[k, j](x, y, z) \qquad \text{Equation 10}$$

where $\overline{\omega}$ denotes the weights of the double integral of Equation 7, and where:

$$E^{Up}[k,j](x,y,z) \triangleq e^{g^{Up}[k,j](x,y,z)} \qquad \text{Equation 11}$$

$$g^{Up}[k,j](x,y,z) \triangleq \lambda_k(-z+i(x\cos\alpha_{kj} + y\sin\alpha_{kj})) \qquad \text{Equation 12}$$

where $\lambda_k$ is the nodes and $S_{outer}$ is the number of nodes of the outer integral of Equation 7. For each k, where k=1 . . . $S_{outer}$, $S_{inner}(k)$ denotes the number of nodes of inner integral, and the nodes are:

$$\alpha_{kj} = \frac{(2j-1)\pi}{2S_{inner}(k)}, \ j = 1 \ldots S_{inner}(k) \quad \text{Equation 13}$$

Equations 9–12 are biased towards the "Up" or +z direction, however, no such bias exists in the expression 1/r. The bias can be eliminated by generalizing Equation 8 to account for the other five directions, referred to herein as "Down" or –z, "East" or +x, "West" or –x, "North" or +y, and "South" or –y in order to obtain five more Equations similar to Equations 9–12, each with the same $\alpha_{kj}$, $\lambda_k$, $\omega_k$, $S_{inner}(k)$ and $S_{outer}$. As used herein, the set of six directions is denoted by "DirSet".

$$g^{Up}[k, j](x, y, z) \triangleq \lambda_k(-z + i(x\cos\alpha_{kj} + y\sin\alpha_{kj})) \quad \text{Equation 14}$$

$$g^{Down}[k, j](x, y, z) \triangleq \lambda_k(z + i(x\cos\alpha_{kj} + y\sin\alpha_{kj})) \quad \text{Equation 15}$$

$$g^{East}[k, j](x, y, z) \triangleq \lambda_k(-x + i(x\cos\alpha_{kj} + y\sin\alpha_{kj})) \quad \text{Equation 16}$$

$$g^{West}[k, j](x, y, z) \triangleq \lambda_k(x + i(x\cos\alpha_{kj} + y\sin\alpha_{kj})) \quad \text{Equation 17}$$

$$g^{North}[k, j](x, y, z) \triangleq \lambda_k(-y + i(x\cos\alpha_{kj} + y\sin\alpha_{kj})) \quad \text{Equation 18}$$

$$g^{South}[k, j](x, y, z) \triangleq \lambda_k(y + i(x\cos\alpha_{kj} + y\sin\alpha_{kj})) \quad \text{Equation 19}$$

and, for each direction dir $\in$ DirSet:

$$E^{dir}[k, j](x, y, z,) \triangleq e^{g^{dir}[k,j](x,y,z)} \quad \text{Equation 20}$$

$$S^{dir}(x, y, z) \triangleq \sum_{k=1}^{S_{outer}} \varpi_k \sum_{j=1}^{S_{inner}(k)} E^{dir}[k, j](x, y, z) \quad \text{Equation 21}$$

where the following definitions for the sets of $D_b$'s apply:

$$D_b^{Up} \triangleq \{(x, y, z) \mid a = 1 \le z \le b, \max(-b, -z-2) \le x, y \le \min(b, z+2)\} \quad \text{Equation 22}$$

$$D_b^{Down} \triangleq \{(x, y, z) \mid a = 1 \le -z \le b, \max(-b, z-2) \le x, y \le \min(b, -z+2)\} \quad \text{Equation 23}$$

$$D_b^{East} \triangleq \{(x, y, z) \mid a = 1 \le x \le b, \max(-b, -x-2) \le z, y \le \min(b, x+2)\} \quad \text{Equation 24}$$

$$D_b^{West} \triangleq \{(x, y, z) \mid a = 1 \le -x \le b, \max(-b, x-2) \le z, y \le \min(b, -x+2)\} \quad \text{Equation 25}$$

$$D_b^{North} \triangleq \{(x, y, z) \mid a = 1 \le y \le b, \max(-b, -y-2) \le x, z \le \min(b, y+2)\} \quad \text{Equation 26}$$

$$D_b^{South} \triangleq \{(x, y, z) \mid a = 1 \le -y \le b, \max(-b, y-2) \le x, y \le \min(b, -y+2)\} \quad \text{Equation 27}$$

It will be understood by those of skill in the art that other definitions of $D_b$ can be defined, where $D_b$ does not capture a relevant particle within its respective cluster.

Thus, Equation 8 can be expressed in a general form that eliminates the bias in the "Up" direction:

$$1/r \approx Re[S^{dir}[k,j](x,y,z)] \quad \text{Equation 28}$$

If no specific direction is given, then the direction dir can be omitted. If no specific indices [kj] are given, then they ca also be omitted. In this case, the approximation in Equation 28 can be rewritten as:

$$1/r \approx Re[S(x,y,z)], \ \forall (x,y,z) \in D_b \quad \text{Equation 29}$$

Note that approximation in Equation 29 is only valid if the directions associated with S(x,y,z) and $D_b$ are the same.

It will now be apparent to those of skill in the art that Equation 28 can be implemented as an exponential expansion operation, expressed in a suitable programming language such as C++, in any suitable programming structure, which determines the inverse distance 1/r between each particle and the collection point CP of the particle's respective cluster.

However, in order to effect the implementation of Equation 28 in a programming language, it is first necessary to determine the values of the coefficients $S_{outer}$, $\lambda_k$, $\omega_k$, and $S_{inner}(k)$. One suitable method for determining these coefficients is the Laguere-Gauss integration, as known in the art. Unfortunately, this can result in an excessively large $S_{inner}(k)$ and $S_{outer}$. Another known method is through the use of orthogonal polynomials for the weight function $W(\lambda) = e^{-\lambda z}$, as taught in M. Cecchi and E. Pirozzi, "A recursive algorithm by the moments method to evaluate a class of numerical integrals over an infinite interval" *Numerical Algorithms*, vol. 10, pp. 155–165, 1995. However, this can have the same drawback as the previous method, and can result in the necessity to solve a system of non-linear equations. A third method is to make use of the exponentially decaying behaviour of $e^{-\lambda z}$ for large $\lambda$ as well as the oscillatory behaviour of Bessel function $J_0(\rho\lambda)$ as discussed in G. A. Evans, "Integrating oscillatory integrands of a non-trigonometric type over a finite range" *Intern. J. Computer Math*, vol. 42, pp. 213–221, 1992; S. Gustafson, "Quadrature rules derived from linear convergence acceleration schemes" in *Numerical Integration IV* (H. Brass and G. Hämmerlin, eds.) pp. 151–165, Birkhäuser, 1992. However, this can result in the loss of the desired exponential form of E[k,j].

Figure 6:
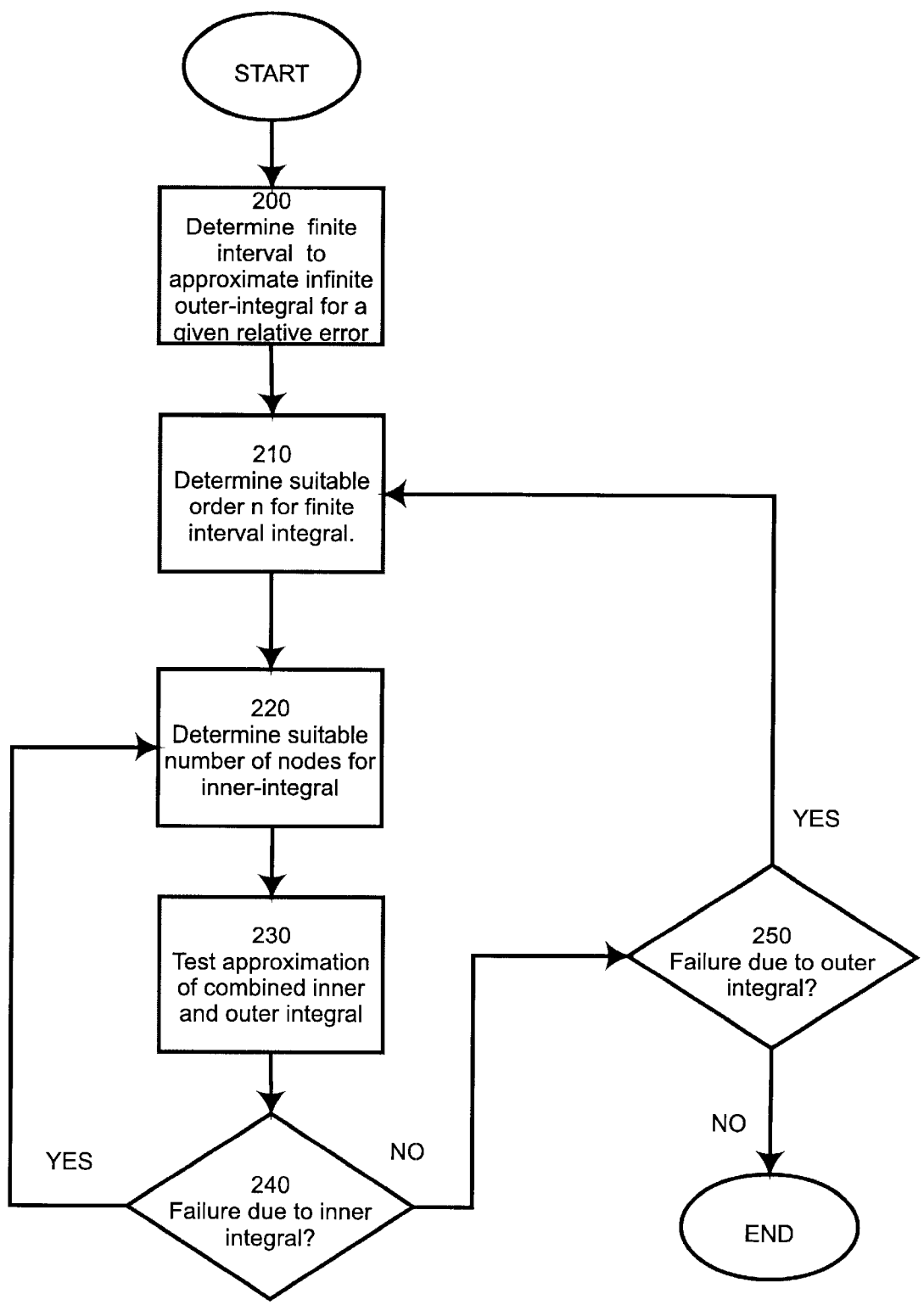
FIG. 6 is a flow-chart of a method for generating Gaussian quadratures in accordance with a particular aspect of the method shown in FIG. 3.

In light of the foregoing shortcomings of the prior art, a presently preferred method for determining $S_{outer}$, $\lambda_k$, $\omega_k$, and $S_{inner}(k)$ is a randomized scheme to generate Gauss quadratures, shown in FIG. 6. In accordance with the method shown in FIG. 6, at step 200 a finite interval is determined to approximate the infinite outer integral of:

$$\frac{1}{r} = Re\left(\frac{1}{\pi}\int_0^\infty e^{-\lambda z}\int_0^\pi e^{i\lambda(x\cos\alpha + y\sin\alpha)}d\alpha d\lambda\right) \quad \text{Equation 30}$$

Note that Equation 30 is identical to Equation 7. By taking advantage of the exponentially decaying behaviour of $e^{-\lambda z}$ and the boundedness (by unit) of the Bessel function $J_0(\rho\lambda)$, the infinite interval [0, ∞] can be replaced with a finite interval [0, U]. Such a replacement is made based on a given relative error, $\epsilon_{rel}$, where $\gamma_o$ and $\gamma_I(\gamma_o + \gamma_I = 1)$ are used to indicate the relative contribution of the outer and inner approximations, respectively, to the overall relative error $\epsilon_{rel}$. The finite interval [0, U] can be determined using the following equation, such that for some number $\gamma_o \epsilon(0,1)$:

$$\frac{\left| \int_0^\infty e^{-\lambda z} J_0(\rho\lambda) d\lambda - \int_0^U e^{-\lambda z} J_0(\rho\lambda) d\lambda \right|}{\frac{1}{r}} \leq \gamma_{oI} \gamma_o \varepsilon_{rel} \quad \text{Equation 31}$$

Any Gauss quadratures that can approximate the finite-interval integral:

$$\frac{\left| \int_0^U e^{-\lambda z} J_0(\rho\lambda) d\lambda - \sum_{k=1}^{S_{outer}} \omega_k^o e^{-\lambda_k z} J_0(\rho\lambda_k) \right|}{\frac{1}{r}} < (1-\gamma_{oI})\gamma_o \varepsilon_{rel} \quad \text{Equation 32}$$

can also approximate the infinite-interval integral:

$$\frac{\left| \int_0^\infty e^{-\lambda z} J_0(\rho\lambda) d\lambda - \sum_{k=1}^{S_{outer}} \omega_k^o e^{-\lambda_k z} J_0(\rho\lambda_k) \right|}{\frac{1}{r}} < \gamma_o \varepsilon_{rel} \quad \text{Equation 33}$$

Next, at step 210, a suitable order n is determined for Legendre-Gauss quadrature for the finite-interval integral $$\int_0^U e^{-\lambda z} J_0(\rho\lambda) d\lambda.$$

A sequence of random points, $(x_i, y_i, z_i)$, are generated that probably satisfies the following condition for all points (x, y, z) in a $D_b$ within DirSet:

$$\frac{\left| \int_0^\infty e^{-\lambda z} J_0(\rho\lambda) d\lambda - \sum_{k=1}^{S_{outer}} \omega_k^o e^{-\lambda_k z} J_0(\rho\lambda_k) \right|}{\frac{1}{r}} < \gamma_o \varepsilon_{rel} \quad \text{Equation 34}$$

where the infinite integral is dealt with directly, because its value 1/r is already known. Where it is not satisfied, a new order n and sequence of random points is used and the condition in Equation 34 is retested, until the condition is satisfied.

Next, at step 220, using the same randomized scheme from step 210, a suitable number of nodes $S_{inner}(k)$ is determined for the Chebyshev-Gauss or midpoint quadrature for the integral representation of the inner-integral of Equation 34, being the integral representation of the Bessel function $J_0(\rho\lambda_k)$ that probably satisfies the following condition for all points (x, y, z) in a $D_b$ within DirSet:

$$\frac{\left| \omega_k^o e^{-\lambda k} J_0(\rho\lambda_k) - \sum_{j=1}^{S_{inner}(k)} \omega_k E[k,j](x,y,z) \right|}{\frac{1}{r}} < \gamma_{I_k} \gamma_I \varepsilon_{rel} \quad \text{Equation 35}$$

where:

$$\omega_k = \frac{\omega_k^o}{S_{inner}(k)} \quad \text{Equation 36}$$

$$\sum_{k=1}^{S_{outer}} \gamma_{I_k} = 1, \gamma_{I_k} > 0, k = 1 \ldots S_{outer} \quad \text{Equation 37}$$

An alternative to satisfying the conditions in Equation 35–37 for step 220 is to ensure that:

$$\frac{\left| \sum_{k=1}^{S_{outer}} \omega_k^o e^{-\lambda_k z} J_0(\rho\lambda_k) - \sum_{k=1}^{S_{outer}} \sum_{j=1}^{S_{inner}(k)} \omega_k E[k,j](x,y,z) \right|}{\frac{1}{r}} < \gamma_I \varepsilon_{rel} \quad \text{Equation 38}$$

and hence, with Equation 33 and the fact that $\gamma_0 + \gamma_I = 1$:

$$\frac{\left| \int_0^\infty e^{-\lambda z} J_0(\rho\lambda) d\lambda - \sum_{k=1}^{S_{outer}} \sum_{j=1}^{S_{inner}(k)} \omega_k E[k,j](x,y,z) \right|}{\frac{1}{r}} < \gamma_I \varepsilon_{rel} \quad \text{Equation 39}$$

Having determined the coefficients for the entire approximation of Equation 29, at step 230 the entire approximation is tested using another sequence of randomized points. At step 240, if a failure is detected due to an error in the inner integral approximation then the method returns to step 220 and a new number of suitable nodes is determined, and this sequence repeats until no failures due to the inner integral approximation are detected. Similarly, at step 250, if a failure is detected due to an error in the outer integral approximation then the method returns to step 210 and another order n is determined. This sequence repeats until no failures due to the inner and outer integral approximation are detected.

Figure 7:
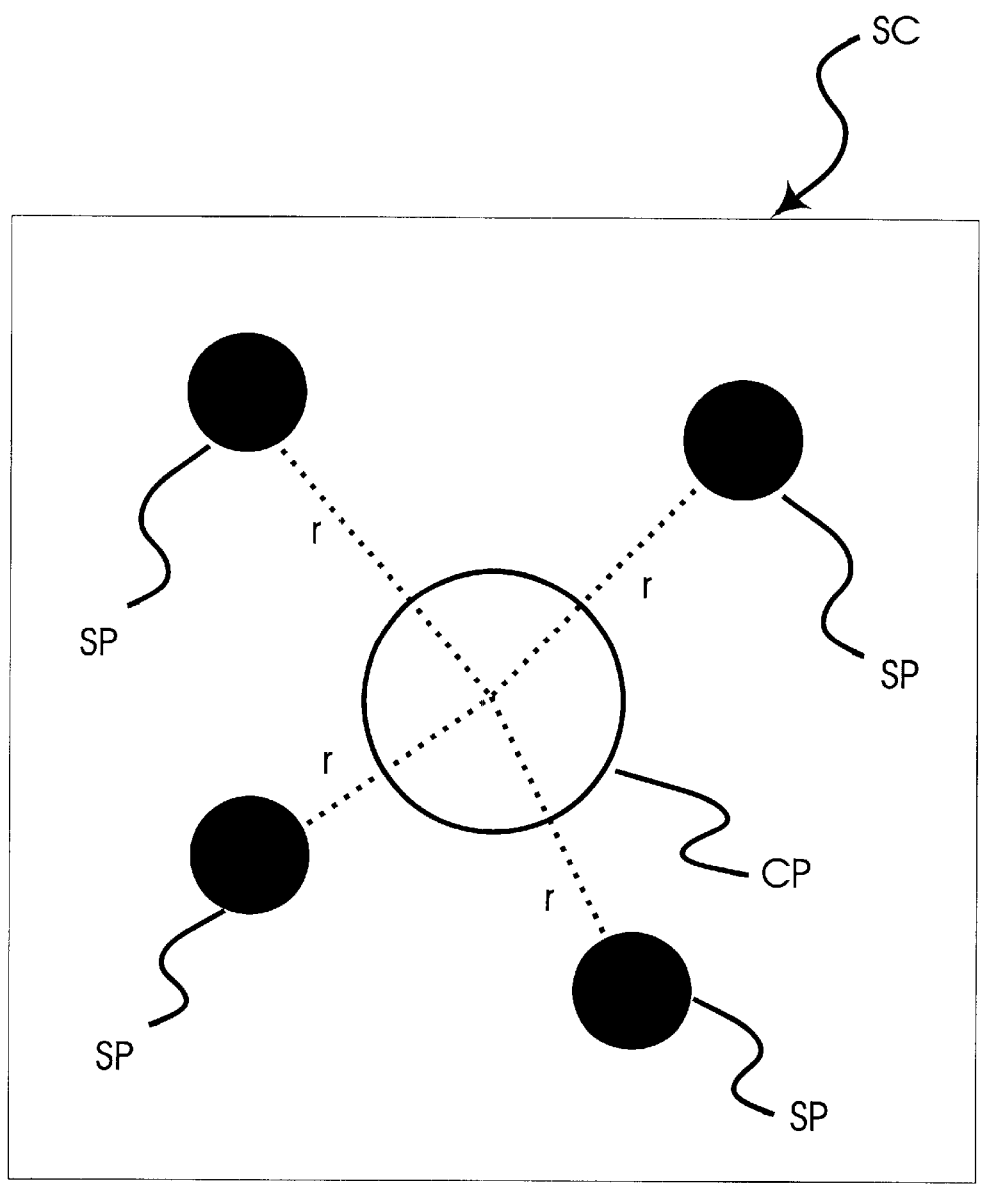
FIG. 7 is a schematic diagram of representative source cluster shown in FIG. 4.

Thus, an exponential expansion operation can be implemented on computer 20 using a computer language representation of Equation 21 that incorporates any suitable method to determine the coefficients of Equation 21. Continuing now with the explanation of step 130, shown in greater detail in FIG. 7, the exponential expansion operation is then performed on each source particle SP to determine the inverse distance, 1/r, between each source particle SP and the centre point CP of its respective source cluster SC. Similarly, the exponential expansion operation is then performed on each target particle TP to determine the inverse distance between each target particle TP and the centre point CP of its respective target cluster TC.

Referring again to FIG. 2, at step 140 a pseudo-particle is defined for each cluster based on the inverse distances 1/r and the charge-like measures of the other particles within the cluster. A suitable operation for defining the charge-like measure of pseudo-particle PP can be expressed as:

$$q_{PP} = \sum_{1}^{n} \frac{q_{P_n}}{r_{P_n}} \qquad \text{Equation 40}$$

where:

$q_{PP}$ is the value of the charge-like measure for the pseudo-particle in the cluster;

n is the number of particles within the cluster;

$q_{P_n}$ is the value of the charge-like measure of the $n^{th}$ particle within the cluster; and $1/r_{P_n}$ is the value of the inverse distance from pseudo-particle to the $n^{th}$ particle within the cluster, as determined from step 130.

It will now be apparent to those of skill in the art that Equation 40 can be implemented as an operation in a suitable programming language such as C++, in any suitable programming structure, which determines the charge-like measure of the pseudo-particle for each cluster.

It will be further apparent that step 130 and step 140 can be combined or performed in parallel, thus obviating the need to store all of the inverse-distances between the collection points CP and the particles within each cluster. For example, $1/r_{P_n}$ in Equation 40 can be substituted with a suitable variation of Equation 28, and the resulting equation can be implemented in a suitable programming language in accordance with known programming techniques.

Figure 8:
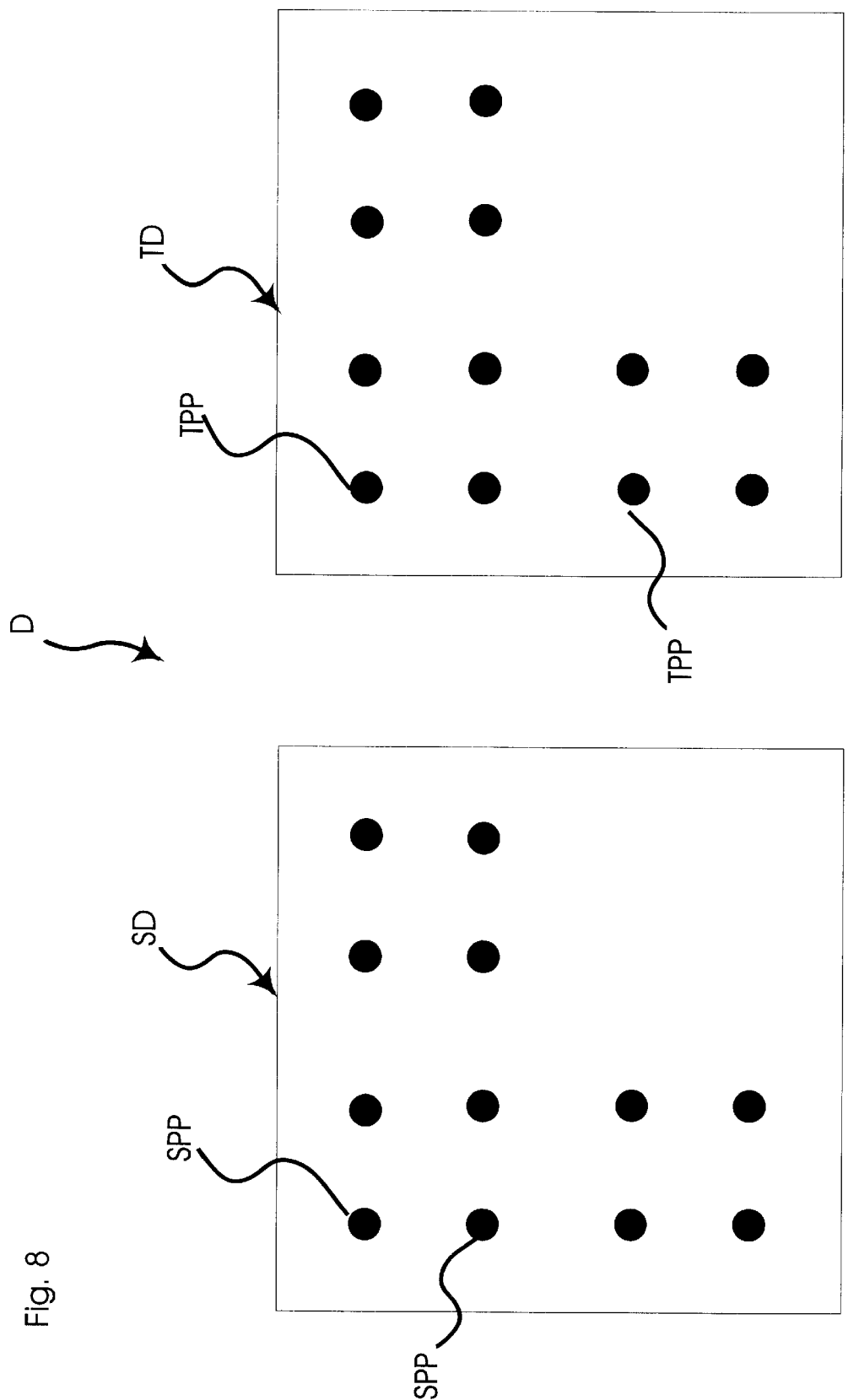
FIG. 8 is a schematic diagram of the domain of FIG. 5 showing a plurality of source pseudo-particles and target pseudo-particles.

Referring now to FIG. 8, step 140 is shown in greater detail where each source particle SP and each target particle TP have now been replaced by representative source pseudo-particles SPP and target pseudo-particles TPP, respectively. Each pseudo-particle has a position at the collection point CP and a has charge-like measure representing the collective charge-like measures of each particle within its cluster. Referring now to FIG. 8, step 140 is shown in greater detail, where source domain SD is shown containing a plurality of source pseudo-particles SPP and target domain TD is shown containing a plurality of target pseudo-particles, each of the pseudo-particles representing the particles from their respective cluster.

Referring again to FIG. 3, at step 150 the method of the present embodiment determines whether a desired level of clustering has been achieved. This determination can be based on variety of considerations. For example, the desire to improve the computational speed of computer 20, particularly where there a large number of particles within domain D, will generally encourage greater clustering. Similarly, the desire to economize the amount of memory required by computer 20 will generally encourage less clustering. Other factors will occur to those of skill in the art, in particular, those skilled in the design of tree-hierarchies within computer software. In general, it is presently preferred that all particles within source domain SD and target domain TD are clustered into a single pseudo-particle at their respective centres. Accordingly, in the present example shown being discussed in the attached FIGURES, at step 150 it is determined that the desired level of clustering has not been achieved, and the method moves to step 160, where source pseudo-particles SPP and target pseudo-particles TPP are redefined as individual source particles and target particles within domain D, and the method returns to steps 110–step 150.

Figure 9:
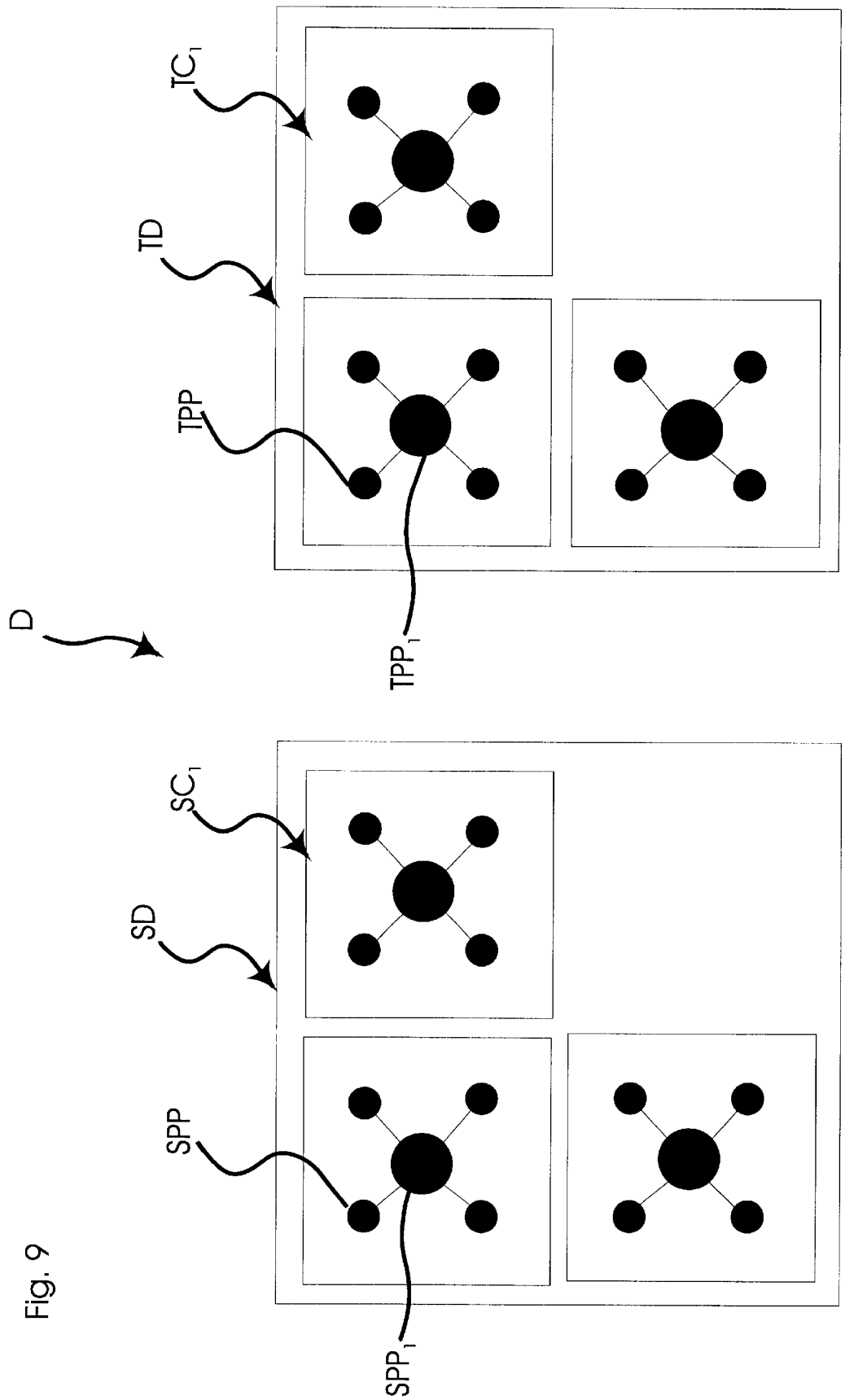
FIG. 9 is a schematic diagram of the domain of FIG. 8 showing a second clustering of the pseudo-particles in FIG. 8 into a second set of groups of pseudo-particles.

Referring now to FIG. 9, the re-performance of steps 110–140 on source pseudo-particles SPP and target pseudo-particles TPP is shown in greater detail, wherein the new source clusters are indicated as $SC_1$ and target clusters are indicated as $TC_1$. Similarly, the new source pseudo-particles are indicated as $SPP_1$ and the new target pseudo-particles are indicated as $TPP_1$.

Figure 10:
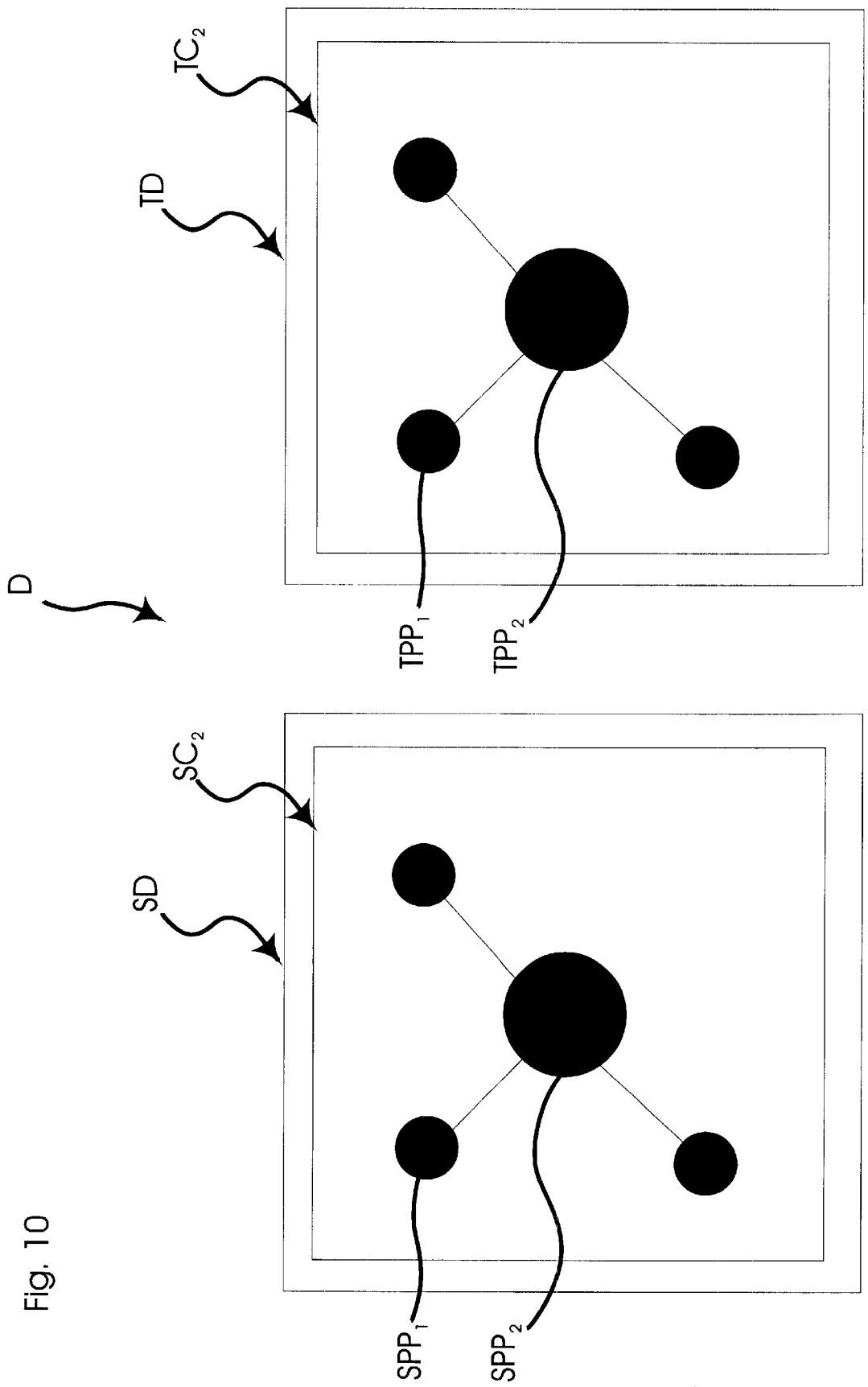
FIG. 10 is a schematic diagram of the domain of FIG. 9 showing a third clustering of the pseudo-particles in FIG. 9 into a single source pseudo-particle and a single target pseudo-particle.

The method returns again to step 150, where it is determined that all particles within source domain SD and target domain TD have not been clustered into a single pseudo-particle at their respective centres, and the method returns to steps 160, and steps 110–140. Referring now to FIG. 10, the re-performance of steps 110–140 on source pseudo-particles $SPP_1$ and target pseudo-particles $TPP_1$ is shown in greater detail, wherein the new source clusters are indicated as $SC_2$ and target clusters are indicated as $TC_2$. The final result is a single source pseudo-particle, indicated as $SPP_2$, and a single target pseudo-particle, indicated as $TPP_2$.

As will now be apparent, if, at step 110, each source particle SP and each target particle TP are originally assigned into a single source cluster SC and target cluster TC, respectively, then source cluster SC encompasses all particles within source domain SD and target cluster TC encompasses all particles within target domain TD and a single pseudo-particle can be determined during one pass through steps 110–140. However, it is presently preferred to have more than one source cluster and one target cluster in order to increase computational speed.

At this point, the method returns to step 150, where it is determined that the desired level of clustering has been achieved now that a single source pseudo-particle $SPP_2$ represents each source particle SP within source domain SD, and a single target pseudo-particle $TPP_2$ represents each target particle TP within target domain TD.

Figure 11:
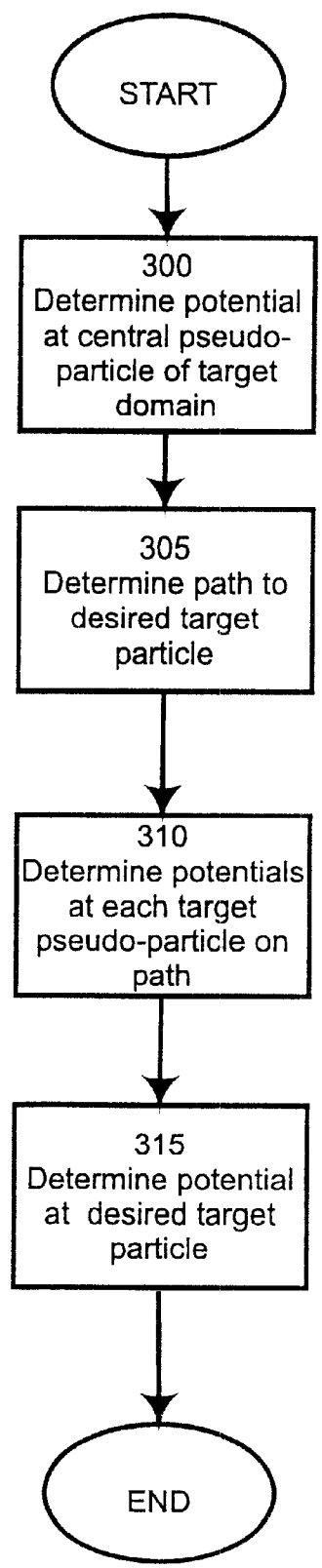
FIG. 11 is a flow-chart of a method for determining the potential at a given target particle within the domain of FIG. 1 in accordance with a particular aspect of the method shown in FIG. 3.
Figure 12:
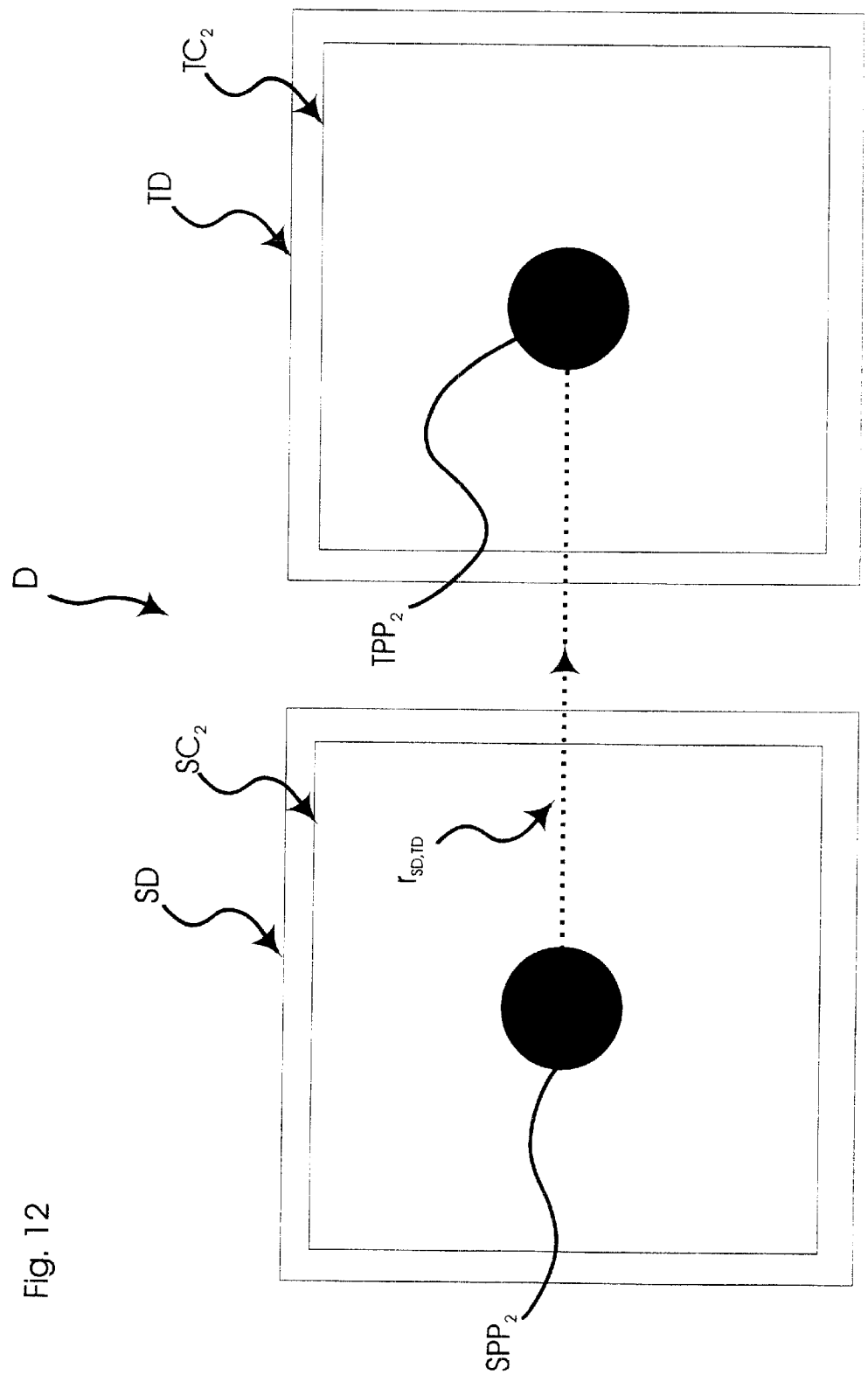
FIG. 12 is a schematic diagram of the domain of FIG. 10 showing the determination of a potential at the single target pseudo-particle in accordance with the method of FIG. 11.

Referring again to FIG. 2, at step 170 the potential at any given target particle TP can now be determined using known methods that utilize the information gathered from the previous steps. It is presently preferred that step 170 is performed over a variety of sub-steps as shown in FIG. 11, wherein at step 300 the potential at the single target pseudo-particle $TPP_2$ in the centre of target domain TD is determined, as shown in greater detail in FIG. 12. The potential target pseudo-particle $TPP_2$ can be determined using the following equation:

$$\Phi(TPP_2) = \frac{q_{SPP_2}}{r_{SD,TD}} \qquad \text{Equation 41}$$

where:

$\Phi(TPP_2)$ is the potential at target pseudo-particle $TPP_2$ $q_{TPP_1}$ is the charge-like measure source pseudo-particle $SPP_2$ $\frac{1}{r_{SD,TD}}$ is the inverse distance between source pseudo-particle $SPP_2$ and target pseudo-particle $TPP_2$.

As will now be apparent to those of skill in the art, $$\frac{1}{r_{SD,TD}}$$

can be determined using the previously-described exponential expansion operation of step 130, summarized in Equation 28. It will be further apparent that the determination of $$\frac{1}{r_{SD,TD}}$$

using Equation 28 can be simplified where the position of source pseudo-particle $SPP_2$ in relation to target pseudo-particle $TPP_2$ is in only one of the six directions enumerated in Equations 22–27.

It will now be apparent to those of skill in the art that Equation 41 can be implemented as an operation in a suitable programming language such as C++, in any suitable programming structure, which determines the charge-like measure of the pseudo-particle for each cluster.

Figure 13:
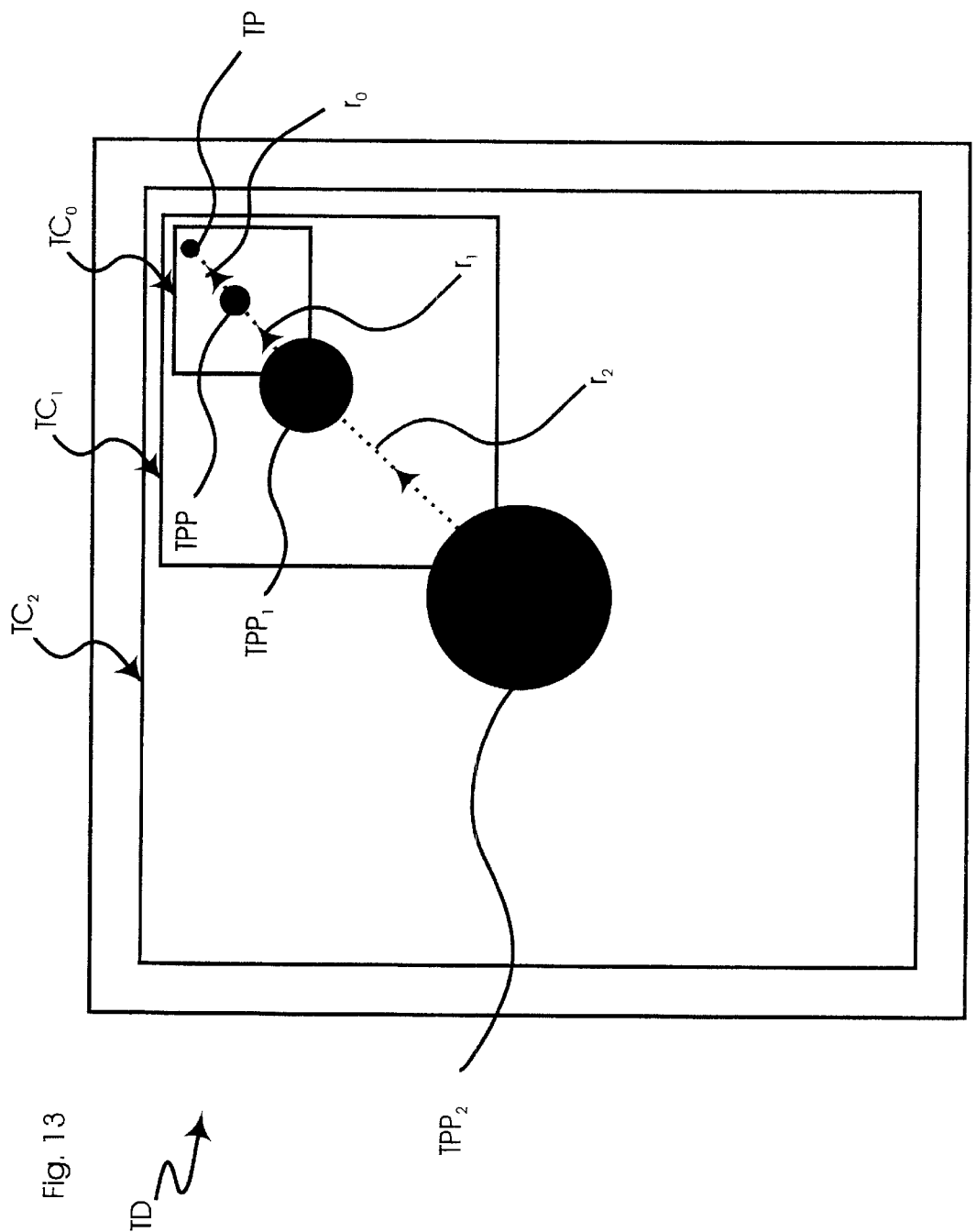
FIG. 13 is a schematic diagram of the domain of FIG. 10 showing the determination of a potential at a single particle in accordance with the method of FIG. 11.

Referring again to FIG. 11, at step 305 the path to the desired target particle TP, where it is sought to determine the potential, is ascertained. Referring now to FIG. 13, step 305 is shown in greater detail, as the path to an exemplary desired target particle TP is shown, wherein $r_2$ denotes the distance between target pseudo-particle $TPP_2$ and target pseudo-particle $TPP_1$; $r_1$ denotes the distance between target pseudo-particle $TPP_1$ and target pseudo-particle TPP; Band $r_0$ denotes the distance between target pseudo-particle TPP and the exemplary desired target particle TP. It will now understood that the distances $r_2$, $r_1$ and $r_0$ have already been determined by the exponential expansion operation of step 130 and are stored within processing unit 24.

Accordingly, at steps 310 and 315, the potentials at target pseudo-particles $TPP_2$, $TPP_1$, TPP target particle TP can be determined using any means known in the art that incorporate the potential $\Phi(TPP_2)$ at $TPP_2$, the charge-like measures of target pseudo-particles $TPP_1$, TPP and target particle TP, and the distances $r_2$, $r_1$ and $r_0$ in order to finally determine the potential at target particle TP.

It will now be apparent that the foregoing embodiments can be used to determine a potential at any target particle TP within target domain TD, or any cluster of target particles TP therein.

While the embodiments discussed herein are directed to particular implementations of the present invention, it will be apparent that the sub-sets and variations to these embodiments are within the scope of the invention. For example, where the arrangements of clustered pseudo-particles are positioned in convenient relation to each it other, it is possible to reduce the number of directions of from Equations 22–27 used in Equation 29 when performing the exponential expansion operation that determines the inverse distances there between. By reducing the number directions, it will be apparent that the computational efficiency of clustering pseudo-particles can be improved.

It will be further understood that gradients associated with such potentials can be readily determined using the same information and using any known method as will occur to those of skill in the art.

In addition to applications for the determination of potentials and gradients, it will be further understood that the present invention can be used in any application where it is desired to determine the inverse distance, and/or distance, between two or more bodies or particles.

It will be further understood that while the embodiments discussed herein are directed primarily to source particles SP and target particles TP dispersed throughout a homogeneous domain, the present invention can be readily modified to determine potentials and gradients within a non-homogenous domain, such as an electrical circuit with varying charge density. For example, such a non-homogeneous domain can be divided into a plurality of homogeneous sub-domains wherein the potentials and/or pseudo-particles representing the particles within the homogeneous sub-domains can be determined using the teachings disclosed herein.

While the embodiments discussed herein are directed to the determination of potential at a target particle in any domain where such a potential is determined by the relationship 1/r, it is also believed that the present invention is suitable for determinations of relationships between particles in domains where the determination is based on the higher orders of 1/r, namely $1/r^n$.

The present invention can be implemented on computer systems having either distributed or parallel processing, as desired.

The present invention provides a novel method and system for determining potentials and gradients in a domain having three-dimensions, including a source domain of containing a plurality of source particles and a target domain containing a plurality of target particles. The domain can be any domain where a potential at a target particle is sought to be determined, such as, for example, an integrated circuit, where it is desired to determine the capacitance or potential electrical field between gate lines and data lines. The invention is useful in a variety of other applications, such as astrophysics, magnetics, plasma physics molecular dynamics, fluids where a potential can be calculated at any target particle TP and such potential is determined, at least in part, by the relationship 1/r (Equation 3) where r is the distance between any two particles within domain D, and 1/r is the inverse distance thereof. The present invention makes use of a novel method for determining inverse distances utilizing an exponential expansion operation approximated using Gauss quadratures.

The utilization of the exponential expansion operation can result in a computer system having a computation time of the order O(N) which has an accuracy or error that can be specified either through user-input or preprogrammed into the computer system. The present invention also allows the use of a single operation, expressed in Equation 28, which can be used in a variety of translations, such as the determination of pseudo-particles, within a domain, and the determination of a potential.

We claim:

1. A method for determining a potential using a computer having a user-input device, a processing device, and a user-output device comprising the steps of:
   receiving data representing positions and charge-like measures for each of a plurality of source particles and target particles;
   assigning said source particles and said target particles into at least one cluster of source particles and at least one cluster of target particles;
   selecting a collection point for each of said clusters;
   performing an exponential expansion operation on each of said particles to determine an inverse distance between each of said collection points and said positions of particles within their respective cluster, said exponential expansion operation being performed over a range determined from a desired level of computational precision of said inverse distance;
   defining a pseudo-particle at each of said collection points based on said inverse distances and said charge-like measures, said pseudo-particle having a position at said collection point and a charge-like measure representing the collective charge-like measures of each particle associated with said collection point; and,
   determining a potential at a desired one of said target particles based on an operation that considers at least in part the position and the charge-like measure of at least one of said pseudo-particles.

2. The method according to claim 1 comprising the additional step of:
   repeating said assigning step through said defining step on said determined pseudo-particles to create at least one source pseudo-particle collectively representing said source particles and to create at least one target pseudo-particle collectively representing said target particles until a desired level of computational efficiency is achieved.

3. The method according to claim 1 wherein said defining step is performed in parallel with said performing step.

4. The method according to claim 1 wherein said exponential expansion operation is derived from a series of sums that approximates an exponential integral representation of Green's function for 1/r.

5. The method according to claim 4 wherein said exponential integral representation includes an inner exponential integral obtained from the Bessel function $J_0$.

6. The method according to claim 4 wherein said exponential integral representation is expressed using Gaussian quadratures.

7. The method according to claim 1 wherein further comprising the step of determining a set of coefficients for said exponential expansion operation.

8. The method according to claim 6 further comprising the step of determining a set of coefficients for said Gaussian quadratures.

9. The method according to claim 8 wherein said coefficients include an order and a number of nodes, said step of determining coefficients comprising the steps of:
   determining a finite interval to approximate said outer-integral given said level of desired computational precision;
   determining a suitable order for said finite interval approximation using a plurality of randomized points within said finite interval approximation and iteratively approximating said order; and
   determining a suitable number of nodes for said inner-integral using a plurality of randomized points within said inner-integral and iteratively approximating said number of nodes.

10. The method according to claim 9 further including the step of:
   testing the validity of said determined coefficients using a series of randomized points within said exponential expansion operation; and,
   repeating one of said order determination step and said node determination step when said testing step fails.

11. The method according to claim 1 wherein said potential determination step includes the steps of:
   determining a potential at a target pseudo-particle representative of said target particles from a source pseudo-particle representative of said source particles based on the charge-like measures of said representative pseudo-particles and the inverse distance therebetween;
   determining a path to said desired target-particle;
   determining potentials at each pseudo-particle on said path based on said potential of said representative target pseudo-particle and the charge-like measures of each pseudo-particle on said path; and
   determining the potential at said desired target particle based on the potential at the pseudo-particle associated therewith.

12. The method according to claim 1 wherein said clusters are formed using a tree-like hierarchy.

13. A system for determining a potential comprising:
   a user-input device;
   a processing unit connected to said user-input device and operable to receive data representing positions and charge-like measures for each of a plurality of source particles and target particles via said user-input device;
   said processing unit being operable to assign a collection point to each said cluster and to perform an exponential expansion operation on each of said particles to determine an inverse distance between each of said collection points and said positions of particles within their respective cluster, said exponential expansion operation being performed over a range determined from a desired level of computational precision of said inverse distance;
   said processing unit being further operable to define a pseudo-particle at each of said collection points based on said inverse distances and said charge-like measures, said pseudo-particle having a position at said collection point and a charge-like measure representing the collective charge-like measures of each particle associated with said collection point;

said processing unit being further operable to determine a potential at a desired one of said target particles based on an operation that considers at least in part the position and the charge-like measure of at least one of said pseudo-particles; and a user-output device connected to said processing unit and operable to output said determined potential.

* * * * *